US009945913B2

United States Patent
Ide et al.

(10) Patent No.: US 9,945,913 B2
(45) Date of Patent: Apr. 17, 2018

(54) MAGNETIC SENSOR, METHOD FOR MANUFACTURING MAGNETIC SENSOR, AND CURRENT SENSOR

(71) Applicant: ALPS ELECTRIC CO., LTD., Ota-ku, Tokyo (JP)

(72) Inventors: Yosuke Ide, Niigata-ken (JP); Masamichi Saito, Niigata-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/237,846

(22) Filed: Aug. 16, 2016

(65) Prior Publication Data

US 2016/0356865 A1    Dec. 8, 2016

Related U.S. Application Data

(63) Continuation of application No. PCT/JP2015/057200, filed on Mar. 11, 2015.

(30) Foreign Application Priority Data

Mar. 28, 2014   (JP) ................................. 2014-069478

(51) Int. Cl.
*G01R 33/02* (2006.01)
*G01R 33/09* (2006.01)
(Continued)

(52) U.S. Cl.
CPC ............. *G01R 33/091* (2013.01); *G01R 3/00* (2013.01); *G01R 15/20* (2013.01); *G01R 15/205* (2013.01);
(Continued)

(58) Field of Classification Search
CPC .................................................. G01R 33/091
(Continued)

(56) References Cited

U.S. PATENT DOCUMENTS 8,063,633 B2 * 11/2011 Raberg ................... B82Y 25/00
324/252
2002/0030489 A1   3/2002 Lenssen et al.
(Continued)

FOREIGN PATENT DOCUMENTS

| JP | 2001-357505 | 12/2001 |
| JP | 2004-206839 | 7/2004 |
| JP | 2012-185044 | 9/2012 |

OTHER PUBLICATIONS

International Search Report for PCT/JP2015/057200 dated May 19, 2015.

*Primary Examiner* — Reena Aurora
(74) *Attorney, Agent, or Firm* — Hunton & Williams LLP (57) ABSTRACT

A magnetic sensor includes: a magnetoresistive effect element having a sensitivity axis in a specific direction in which a fixed magnetic layer, a nonmagnetic material layer, and a free magnetic layer are laminated in this order; an antiferromagnetic layer which generates an exchange coupling bias with the free magnetic layer and which aligns the magnetization direction thereof in a predetermined direction provided on the free magnetic layer; and a ferromagnetic layer which generates an exchange coupling bias with the antiferromagnetic layer and which aligns the magnetization direction thereof in a predetermined direction provided on the antiferromagnetic layer. The magnetization direction on the exchange coupling bias in the free magnetic layer is the same direction as that on the exchange coupling bias in the ferromagnetic layer, and the ferromagnetic layer is able to impart a reflux magnetic field having a component along a sensitivity axis to the free magnetic layer.

10 Claims, 3 Drawing Sheets

(51) Int. Cl.
  *G01R 15/20*   (2006.01)
  *H01L 43/08*   (2006.01)
  *H01L 43/12*   (2006.01)
  *G01R 3/00*    (2006.01)
  *H01L 43/10*   (2006.01)
  *G01R 19/00*   (2006.01)
  *G01R 33/00*   (2006.01)
  *H01L 43/02*   (2006.01)

(52) U.S. Cl.
  CPC ..... *G01R 19/0092* (2013.01); *G01R 33/0052* (2013.01); *G01R 33/09* (2013.01); *G01R 33/093* (2013.01); *H01L 43/02* (2013.01); *H01L 43/08* (2013.01); *H01L 43/10* (2013.01); *H01L 43/12* (2013.01)

(58) Field of Classification Search
  USPC .......................................... 324/252, 207.21
  See application file for complete search history.

(56) References Cited

U.S. PATENT DOCUMENTS

2009/0016097 A1* 1/2009 Grino ............... G11C 11/16
                                                 365/158
2013/0257422 A1 10/2013 Koike et al.

* cited by examiner

MAGNETIC SENSOR, METHOD FOR MANUFACTURING MAGNETIC SENSOR, AND CURRENT SENSOR

CLAIM OF PRIORITY

This application is a Continuation of International Application No. PCT/JP2015/057200 filed on Mar. 11, 2015, which claims benefit of Japanese Patent Application No. 2014-069478 filed on Mar. 28, 2014. The entire contents of each application noted above are hereby incorporated by reference.

BACKGROUND OF THE INVENTION

1. Field of the Invention

The present invention relates to a magnetic sensor, a method for manufacturing a magnetic sensor, and a current sensor including a magnetic sensor.

2. Description of the Related Art

In fields relating to, for example, motor driving techniques of electric cars and hybrid cars, since a relatively large current is used, a current sensor capable of measuring a large current in a non-contact manner has been required. As the current sensor described above, a sensor which uses a magnetic sensor detecting an induction magnetic field from a current to be measured has been known. As a magnetic detection element for a magnetic sensor, for example, a magnetoresistive effect element, such as a Giant magnetoresistance (GMR) element, may be mentioned.

A GMR element has as a basic structure, a laminate structure in which a fixed magnetic layer and a free magnetic layer are laminated to each other with a nonmagnetic material layer provided therebetween. The magnetization direction of the fixed magnetic layer is fixed in one direction by an exchange coupling bias by a laminate structure of an antiferromagnetic layer and a ferromagnetic layer or by the RKKY interaction (indirect exchange interaction) by a self-pinning structure in which two ferromagnetic layers are laminated to each other with a nonmagnetic interlayer provided therebetween. The magnetization direction of the free magnetic layer is configured to be changeable in accordance with an external magnetic field.

In a current sensor formed by using a magnetic sensor including a GMR element, since the induction magnetic field from a current to be measured is applied to the GMR element, the magnetization direction of the free magnetic layer is changed. Since the electric resistance of the GMR element is changed by the relationship between the magnetization direction of this free magnetic layer and the magnetization direction of the fixed magnetic layer, by the measurement of this electric resistance, the magnetization direction of the free magnetic layer can be detected. In addition, based on the magnetization direction detected by the magnetic sensor, the magnitude and the direction of the current to be measured which generates the induction magnetic field can be obtained.

Incidentally, in an electric car or a hybrid car, the drive of a motor is controlled based on a current value in some cases, or a method to control a battery is adjusted in accordance with a current value flowing thereinto in some cases. Hence, in order to more accurately detect a current value, a current sensor formed by using a magnetic sensor is required to improve the measurement accuracy of the magnetic sensor.

In order to improve the measurement accuracy of the magnetic sensor, for example, reduction in offset, reduction in variation of an output signal, and improvement in linearity (output linearity) are required to be realized. As one preferable method to respond to those requirements, reduction in hysteresis of the GMR element of the magnetic sensor may be mentioned. As a particular example of the method to reduce the hysteresis of the GMR element, there may be mentioned a method in which by application of a bias magnetic field to a free magnetic layer, the magnetization direction of the free magnetic layer is aligned even in the state in which the induction magnetic field from the current to be measured is not applied.

As a method to apply a bias magnetic field to a free magnetic layer, in International Publication No. 2012/081377, a method in which a hard bias layer formed of a permanent magnet is provided has been disclosed. In addition, in Japanese Unexamined Patent Application Publication No. 2012-185044, a method has been disclosed in which an antiferromagnetic layer capable of generating an exchange coupling bias with a free magnetic layer and of aligning the magnetization direction of the free magnetic layer in a predetermined direction in a magnetization changeable state is laminated on the free magnetic layer.

SUMMARY OF THE INVENTION

Technical Problem

The present invention provides, by the use of the fundamental technique disclosed in Japanese Unexamined Patent Application Publication No. 2012-185044 in which a single magnetic domain state is formed in the free magnetic layer based on the exchange coupling bias, a magnetic sensor capable of further reducing the hysteresis of a magnetoresistive effect element, a method for manufacturing a magnetic sensor, and a current sensor using a magnetic sensor.

Solution to Problem

Through intensive research carried out by the present inventors to achieve the subjects described above, the following new finding was obtained. That is, in a method in which the magnetization direction of a free magnetic layer is aligned by an exchange coupling bias in a state in which an external magnetic field (in this specification, an external magnetic field to be measured is also called "magnetic field to be measured"), such as the induction magnetic field from a current to be measured, is not applied (in this specification, the magnetization direction based on the exchange coupling bias generated in the free magnetic layer is also called "initial magnetization direction"), in the case in which even when the application of the magnetic filed to be measured is completed, the magnetization in a direction different from the initial magnetization direction remains (in this specification, a component of the remnant magnetization in this free magnetic layer orthogonal to the initial magnetization direction is also called "remnant orthogonal component"), by applying a magnetic field having a component antiparallel to the remnant orthogonal component, the remnant orthogonal component can be reduced.

The above finding will be particularly described below. When the external magnetic field, such as the induction magnetic field from the current to be measured, is applied to the free magnetic layer, the magnetization direction of the free magnetic layer is rotated from the initial magnetization direction by the influence of the magnetic field to be measured. When the change in element resistance value caused by this magnetization rotation is measured, the magnitude and the direction of the magnetic field to be measured can be detected. However, even after the application of the magnetic field to be measured is completed, the magnetization direction of the free magnetic layer is not returned completely to the initial magnetization direction, the component orthogonal to the initial magnetization direction remains in the magnetization direction of the free magnetic layer, and this remnant component is partially responsible to cause the hysteresis of a magnetoresistive effect element. Accordingly, when a magnetic field antiparallel to the remnant orthogonal component of the free magnetic layer is applied from the outside, the magnitude of the remnant orthogonal component can be reduced, and the magnetization direction of the free magnetic layer can be easily returned to the initial magnetization direction. In this specification, a magnetic field applied to the free magnetic layer for this purpose is also called "hysteresis cancel magnetic field" or "HC magnetic field".

Although the HC magnetic field may be applied using a hard bias layer, since the hard layer is arranged in many cases to form the structure different from a basic laminate structure (seed layer/fixed magnetic layer/nonmagnetic material layer/free magnetic layer) of a magnetoresistive effect element, the positional relationship between the hard bias layer and the free magnetic layer is liable to be varied, and hence, the magnitude and the direction of the HC magnetic field may be varied in some cases.

Accordingly, as a result obtained by further research, it was found that when a ferromagnetic layer (in this specification, referred to as "hysteresis cancel layer" or "HC layer") is laminated at a side of an antiferromagnetic layer opposite to a side thereof facing the free magnetic layer, the antiferromagnetic layer being laminated thereon in order to align the magnetization direction of the free magnetic layer, the HC magnetic field can be effectively applied to the free magnetic layer.

That is, in the state in which the magnetic field to be measured is not applied, the exchange coupling bias with the antiferromagnetic layer is also generated in the HC layer as in the free magnetic layer. In addition, when the magnetic field to be measured is applied to a magnetoresistive effect element including the HC layer, the magnetization direction of the HC layer is also rotated by the influence of the magnetic field to be measured, and when the application thereof is completed, as is the case of the free magnetic layer, a magnetization having a component orthogonal to the magnetization direction based on the exchange coupling bias remains. Accordingly, when the magnetization direction in the HC layer based on the exchange coupling bias with the antiferromagnetic layer is set in the same direction as the initial magnetization direction in the free magnetic layer, a reflux magnetic field based on the remnant magnetization of the HC layer can be applied to the free magnetic layer as an external magnetic field having a component antiparallel to the remnant orthogonal component of the free magnetic layer. As a result, the remnant orthogonal component of the free magnetic layer is reduced, and hence, the hysteresis of the GMR element can be reduced.

In addition, since the temperature dependence of the reflux magnetic field applied to the free magnetic layer from the HC layer has the same basic tendency as that of the temperature dependence of the magnitude of the exchange coupling bias between the free magnetic layer and the antiferromagnetic layer, the HC layer also functions as a temperature compensation mechanism of the magnetoresistive effect element, so that the change in measurement value of the magnetic sensor caused by the change in temperature can be reduced.

The present invention completed based on the finding described above is as follows.

(1) A magnetic sensor includes a magnetoresistive effect element having a sensitivity axis in a specific direction; the magnetoresistive effect element has a laminate structure in which a fixed magnetic layer and a free magnetic layer are laminated to each other with a nonmagnetic material layer provided therebetween; at a side of the free magnetic layer opposite to the side thereof facing the nonmagnetic material layer, an antiferromagnetic layer which is able to generate an exchange coupling bias with the free magnetic layer and which is able to align the magnetization direction of the free magnetic layer in a predetermined direction in a magnetization changeable state is provided; at a side of the antiferromagnetic layer opposite to the side thereof facing the free magnetic layer, a ferromagnetic layer which generates an exchange coupling bias with the antiferromagnetic layer and which is able to align the magnetization direction thereof in a predetermined direction in a magnetization changeable state is provided; the magnetization direction based on the exchange coupling bias generated in the free magnetic layer is the same direction as the magnetization direction based on the exchange coupling bias generated in the ferromagnetic layer; and the ferromagnetic layer is able to impart a reflux magnetic field having a component in a direction along the sensitivity axis to the free magnetic layer.

(2) In the magnetic sensor described in the above (1), the magnitude of the exchange coupling bias generated in the ferromagnetic layer and the thickness thereof are preferably set so as to reduce the component of a remnant magnetization of the free magnetic layer in the direction along the sensitivity axis.

(3) In the magnetic sensor described in the above (1) or (2), the antiferromagnetic layer is preferably formed of IrMn.

(4) In the magnetic sensor described in any one of the above (1) to (3), the fixed magnetic layer is preferably a laminate in which a first magnetic layer and a second magnetic layer in contact with the nonmagnetic material layer are laminated to each other with a nonmagnetic interlayer provided therebetween, and the first magnetic layer and the second magnetic layer preferably form a self-pinning structure in which the magnetizations thereof are fixed in antiparallel to each other.

(5) In the magnetic sensor described in any one of the above (1) to (4), the magnitude of the exchange coupling bias generated in the ferromagnetic layer and the thickness thereof are preferably set so as to reduce a high-temperature storage time dependence of the sensitivity of the free magnetic layer.

(6) A method for manufacturing a magnetic sensor includes steps of sequentially laminating on a substrate, a seed layer, a fixed magnetic layer, a nonmagnetic material layer, a free magnetic layer, an antiferromagnetic layer, and a ferromagnetic layer in this order, the method comprising: a pinning layer lamination step of obtaining the fixed magnetic layer in the form of a laminate having a self-pinning structure in which while a magnetic field is applied in a first direction orthogonal to the lamination direction, a first magnetic layer is laminated on the seed layer, and a nonmagnetic interlayer and a second magnetic layer are then sequentially laminated; a nonmagnetic material layer lamination step of laminating the nonmagnetic material layer on the second magnetic layer; and a free magnetic layer lamination step in which while a second magnetic field is applied in a direction different from the first direction, the free magnetic layer, the antiferromagnetic layer, and the ferromagnetic layer are sequentially laminated on the nonmagnetic material layer.

(7) In the method for manufacturing a magnetic sensor described in the above (6), the structure of the ferromagnetic layer is preferably set so that a reflux magnetic field in a direction parallel to the first direction is applicable from the ferromagnetic layer to the free magnetic layer.

(8) In the method for manufacturing a magnetic sensor described in the above (6) or (7), from the step of laminating the seed layer to the step of laminating the ferromagnetic layer, no magnetic field annealing treatment is preferably performed.

(9) In the method for manufacturing a magnetic sensor described in the above (8), the antiferromagnetic layer is preferably formed from IrMn.

(10) A current sensor includes the magnetic sensor described in any one of the above (1) to (5).

Advantageous Effects of Invention

According to the present invention, a magnetic sensor capable of reducing the hysteresis of a magnetoresistive effect element can be provided. In addition, a method for manufacturing the magnetic sensor and a current sensor formed by using the magnetic sensor can also be provided.

DESCRIPTION OF THE PREFERRED EMBODIMENTS

1. Magnetic Sensor

Figure 1:
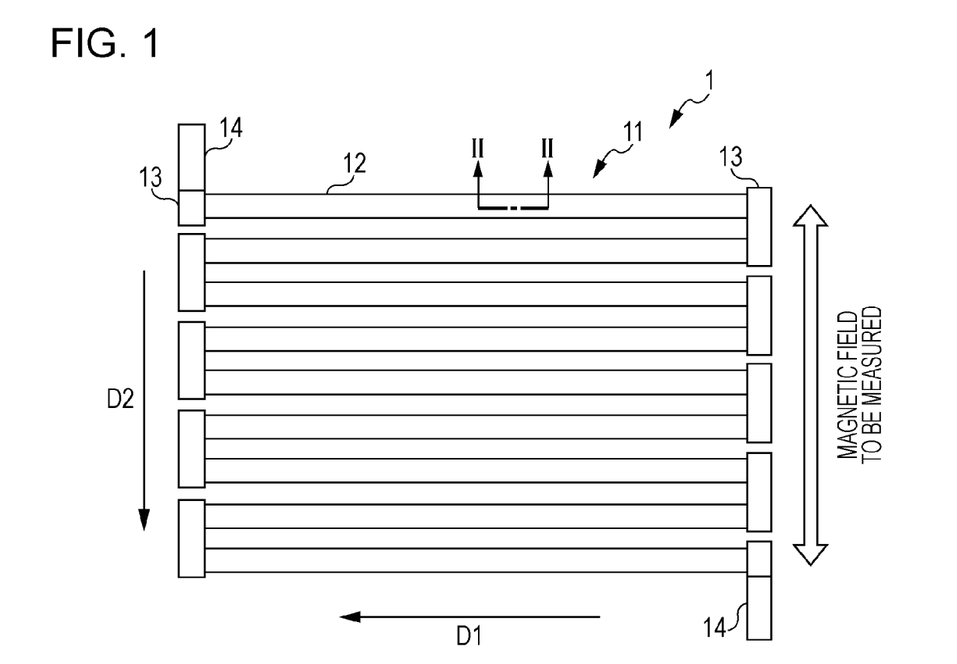
FIG. 1 is an enlarged plan view of a magnetoresistive effect element forming a magnetic sensor according to one embodiment of the present invention.
Figure 2:
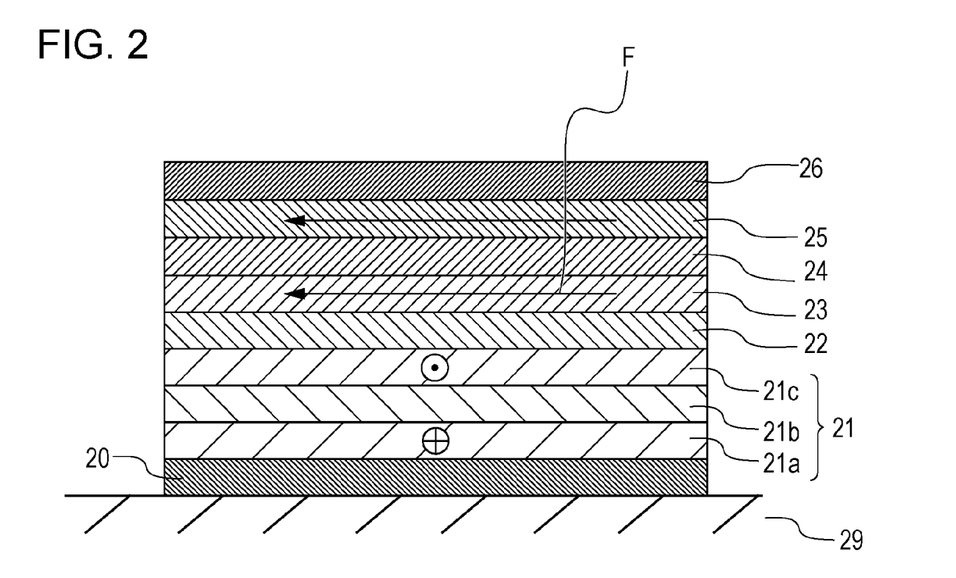
FIG. 2 is an arrow cross-sectional view along the line II-II shown in FIG. 1.

FIG. 1 is a conceptual view (plan view) of a magnetic sensor according to one embodiment of the present invention, and FIG. 2 is an arrow cross-sectional view along the line II-II shown in FIG. 1.

A magnetic sensor 1 according to one embodiment of the present invention includes as shown in FIG. 1, a stripe-shaped magnetoresistive effect element 11. The magnetoresistive effect element 11 has a shape (meandering shape) in which belt-shaped long patterns 12 (stripes) are arranged so as to be in parallel to each other in a stripe longitudinal direction D1 (hereinafter, also simply referred to as "longitudinal direction D1"). In this meandering-shaped magnetoresistive effect element 11, a sensitivity axis direction is a direction D2 (hereinafter, also simply referred to as "width direction D2") orthogonal to the longitudinal direction D1 of the long pattern 12. Hence, when the magnetic sensor 1 including this meandering-shaped magnetoresistive effect element 11 is used, the magnetic field to be measured and the cancel magnetic field are applied so as to be along the width direction D2.

Among the belt-shaped long patterns 12 arranged in parallel to each other, long patterns 12 other than those located at the end portions in the arrangement direction are each connected to a belt-shaped long pattern 12 located at the most closest position at each end position with an electric conduction portion 13 provided therebetween. The long patterns 12 located at the end portions in the arrangement direction are each connected to a connection terminal 14 with an electric conductive portion 13 provided therebetween. Accordingly, the magnetoresistive effect element 11 has the structure in which between the two connection terminals 14 and 14, the long patterns 12 are connected to each other in series with the electric conductive portions 13 provided therebetween. Although materials for the electric conduction portions 13 and the connection terminals 14 are not limited to nonmagnetic or magnetic, the electric conduction portions 13 and the connection terminals 14 are each preferably formed of a material having a low electric resistance. The magnetic sensor 1 is able to output a signal of the magnetoresistive effect element 11 from the two connection terminals 14 and 14. The signal of the magnetoresistive effect element 11 output from the connection terminals 14 and 14 is input in a computing portion which is not shown, and in the computing portion, the magnetic field to be measured is calculated based on the signal described above.

As shown in FIG. 2, the long patterns 12 of the magnetoresistive effect element 11 are each formed so that on a chip 29, a seed layer 20, a fixed magnetic layer 21, a nonmagnetic material layer 22, a free magnetic layer 23, an antiferromagnetic layer 24, an HC layer 25, and a protective layer 26 are laminated in this order from the bottom with insulating layers and the like which are not shown and which are provided therebetween. A film formation method of those layers is not limited. For example, the film formation may be performed by sputtering.

The seed layer 20 is formed, for example, of NiFeCr or Cr.

The fixed magnetic layer 21 has a self-pinning structure including a first magnetic layer 21a, a second magnetic layer 21c, and a nonmagnetic interlayer 21b located between the first magnetic layer 21a and the second magnetic layer 21c.

As shown in FIG. 2, the fixed magnetization direction of the first magnetic layer 21a and the fixed magnetization direction of the second magnetic layer 21c are antiparallel to each other. In addition, the fixed magnetization direction of the second magnetic layer 21c is the fixed magnetization direction of the fixed magnetic layer 21, that is, is the sensitivity axis direction.

As shown in FIG. 2, the first magnetic layer 21a is formed on the seed layer 20, and the second magnetic layer 21c is formed in contact with the nonmagnetic material layer 22 which will be described later.

The first magnetic layer 21a of this embodiment is preferably formed of a FeCo alloy which is a high coercive material as compared to that of the second magnetic layer 21c.

The second magnetic layer 21c in contact with the nonmagnetic material layer 22 is a layer which contributes to a magnetoresistive effect (in particular, the GMR effect), and as the second magnetic layer 21c, a magnetic material which can increase the difference in mean free path between a conduction electron having an up spin and a conduction electron having a down spin may be selected.

In the structure shown in FIG. 2, the difference in magnetization amount (saturated magnetization Ms·film thickness t) between the first magnetic layer 21a and the second magnetic layer 21c is adjusted to be substantially zero.

Since having the self-pinning structure, the fixed magnetic layer 21 of this embodiment includes no antiferromagnetic layer. Accordingly, the temperature characteristics of the magnetoresistive effect element 11 are not restricted by the blocking temperature of the antiferromagnetic layer.

In order to increase the magnetization fixing force of the fixed magnetic layer 21, it has been believed important to increase a coercive force Hc of the first magnetic layer 21a, to adjust the difference in magnetization amount between the first magnetic layer 21a and the second magnetic layer 21c to substantially zero, and to increase the antiparallel coupling magnetic field by the RKKY interaction generated between the first magnetic layer 21a and the second magnetic layer 21c by further adjusting the film thickness of the nonmagnetic interlayer 21b. By the adjustment appropriately performed as described above, the magnetization of the fixed magnetic layer 21 is more tightly fixed without being influenced by a magnetic field from the outside.

The nonmagnetic material layer 22 is formed of Cu (copper) or the like. In addition, although being formed of a single layer structure or a laminate structure by using NiFe, CoFe, or the like, the free magnetic layer 23 shown in FIG. 2 is not limited thereto. A material forming the protective layer 26 is not limited. Ta (tantalum) or the like may be mentioned by way of example.

As shown in FIG. 2, on the upper surface of the free magnetic layer 23, the antiferromagnetic layer 24 is formed. The antiferromagnetic layer 24 is preferably formed of IrMn which can generate an exchange coupling bias (exchange coupling magnetic field: Hex) with the free magnetic layer 23 without performing an annealing treatment in a magnetic field. In the case in which the antiferromagnetic layer 24 is used which can generate an exchange coupling bias with the free magnetic layer 23 without performing an annealing treatment in a magnetic field, PtMn or NiMn, each of which requires an annealing treatment in a magnetic field, is preferably not used.

The thickness of the antiferromagnetic layer 24 and the magnitude of the exchange coupling bias generated in the free magnetic layer 23 are not limited as long as the magnetization direction of the free magnetic layer 23 can be aligned with respect to the magnetic field to be measured in a magnetization changeable state. For example, the thickness of the antiferromagnetic layer 24 is approximately 40 to 80 A°. In addition, the magnitude of the exchange coupling bias generated in the free magnetic layer 23 is approximately 50 to 300 Oe (approximately 4 kA/m to approximately 24 kA/m). A magnetization direction F of the free magnetic layer shown in FIG. 2 indicates the initial magnetization direction, and the magnetization direction F of the free magnetic layer 23 is aligned in a direction orthogonal to the fixed magnetization direction (fixed magnetization direction of the second magnetic layer 21c) of the fixed magnetic layer 21.

In FIG. 2, although being formed over the entire upper surface of the free magnetic layer 23, the antiferromagnetic layer 24 is not limited thereto and may be formed thereon to partially have a non-covering portion. However, when the antiferromagnetic layer 24 is formed over the entire surface of the free magnetic layer 23, since all the free magnetic layer 23 can be appropriately single-domained in one direction, the hysteresis can be further reduced, and hence, the measurement accuracy can be preferably improved.

In the magnetoresistive effect element 11 according to one embodiment of the present invention, the HC layer 25 which generates an exchange coupling bias with the antiferromagnetic layer 24 and which can align the magnetization direction thereof in a predetermined direction in a magnetization changeable state is provided at a side of the antiferromagnetic layer 24 opposite to the side thereof facing the free magnetic layer 23, that is, at an upper surface side of the antiferromagnetic layer 24 in FIG. 2. The HC layer 25 is a ferromagnetic layer formed of a ferromagnetic material so as to be able to appropriately generate an exchange coupling bias with the antiferromagnetic layer 24.

The antiferromagnetic layer 24 and the HC layer 25 are set so that the magnetization direction of the exchange coupling bias generated in the free magnetic layer 23 by the antiferromagnetic layer 24 is the same direction as the magnetization direction of the exchange coupling bias generated in the HC layer 25 by the antiferromagnetic layer 24. In addition, the HC layer 25 can impart to the free magnetic layer 23, a reflux magnetic field having a component along the sensitivity axis, that is, along the width direction D2. When the magnetoresistive effect element 11 has the structure in which as shown in FIG. 1, the long patterns 12 located apart from each other are provided, as long as the HC layer 25 has not a specific structure having an excessively small thickness or the like, in general, a component of the reflux magnetic field from the HC layer 25 along the sensitivity axis can be easily imparted to the free magnetic layer 23. In the following description, the component of the reflux magnetic field from the HC layer 25 along the sensitivity axis is also called "reflux orthogonal component".

Since the magnetization direction of the HC layer 25 is rotated as is the case of the free magnetic layer 23 so as to be along the direction of the magnetic field to be measured, such as the induction magnetic field from the current to be measured, the direction of the reflux orthogonal component imparted to the free magnetic layer 23 from the HC layer 25 is opposite to the direction of the magnetic field to be measured. Hence, when the remnant orthogonal component is present in the free magnetic layer 23 after the magnetic field to be measured is applied, the reflux orthogonal component based on the remnant magnetization of this HC layer 25 is in a direction opposite to that of the remnant orthogonal component in the free magnetic layer 23 and functions to delete the remnant orthogonal component of the free magnetic layer 23. Hence, in the magnetoresistive effect element 11 according to one embodiment of the present invention, the hysteresis is likely to be reduced.

A material forming the HC layer 25 is not particularly limited as long as a ferromagnetic material is used. As the material described above, for example, there may be mentioned a NiFeNb-based material, a NiFe-based material, or a CoFe-based material. Among those materials mentioned above, in order to decrease the shunt loss, the HC layer 25 is preferably formed by using a material, such as a NiFeNb-based material, having a relatively high volume resistivity.

The HC layer 25 may have either a single layer structure or a laminate structure. In order to improve the balance among appropriate generation of the exchange coupling bias with the antiferromagnetic layer 24, appropriate generation of the magnetization rotation of the HC layer 25 when the magnetic field to be measured is applied, generation of the reflux orthogonal component from the HC layer 25 so as to reduce the remnant orthogonal component in the free magnetic layer 23, and reduction in shunt loss, the HC layer 25 preferably has a laminate structure in which on the antiferromagnetic layer 24, a relatively thin layer formed of a material, such as a NiFe-based material, appropriately generating an exchange coupling bias is located so as to be in contact therewith, and a relatively thick layer formed of a material, such as a NiFeNb-based material, having a relatively high volume resistivity is located at a position relatively far from the antiferromagnetic layer 24.

In the case in which the HC layer 25 has the laminate structure as described above, when the composition and the thickness of each layer are adjusted, the linearity of a magnetic sensor including the magnetoresistive effect element 11 can also be improved. In addition, when an annealing treatment (in this annealing treatment, the application of a magnetic field is not required) is performed on the magnetoresistive effect element 11 including the HC layer 25, the linearity of the magnetic sensor including the magnetoresistive effect element 11 may be improved in some cases.

As described below, the HC layer 25 is also be able to function as a temperature compensation mechanism of the magnetoresistive effect element 11. The magnitude of the exchange coupling bias generated by the antiferromagnetic layer 24 with the free magnetic layer 23 or the HC layer 25 has a high-temperature storage time dependence due to various factors (variation in composition, bonding-interface mismatch, counter diffusion, and the like), and as a basic tendency, when the storage time in a high-temperature environment is longer, the magnitude of the exchange coupling bias is increased.

Hence, in a magnetoresistive effect element including no HC layer 25, when the magnitude of the exchange coupling bias generated in the free magnetic layer is increased after a high measurement environment temperature is maintained for a long time, the magnetization rotation angle of the free magnetic layer is decreased when an external magnetic field is applied to the magnetoresistive effect element, and the measurement is performed so that the applied magnetization is apparently decreased. Hence, when a magnetic sensor including this magnetoresistive effect element is used as a current sensor, as the storage time in a high temperature environment is longer, the detection current is decreased. On the other hand, in the case in which the HC layer 25 is used as is the magnetoresistive effect element 11 according to this embodiment, since the exchange coupling bias generated in the HC layer 25 also has a high-temperature storage time dependence having a basic tendency similar to that of the exchange coupling bias generated in the free magnetic layer 23, the magnitude of the reflux magnetic field from the HC layer 25 is increased as the storage time in a high-temperature environment is shorter, and is decreased as the storage time in a high-temperature environment is longer.

That is, in the case in which the storage time in a high-temperature environment is short at which the magnetization rotation angle of the free magnetic layer 23 is relatively increased, the reflux orthogonal component from the HC layer 25 functioning to decrease the magnetic rotation angle is relatively large, and in the case in which the storage time in a high-temperature environment is long at which the magnetization rotation angle of the free magnetic layer 23 is relatively decreased, the reflux orthogonal component from the HC layer 25 functioning to decrease the magnetic rotation angle is relatively decreased. Hence, the change in magnetization rotation of the free magnetic layer 23 based on the change in storage time in a high-temperature environment is not likely to be generated, and the change in measurement value caused by the storage time in a high-temperature environment is not likely to be generated. Hence, in order to enable the temperature compensation mechanism by the HC layer 25 to appropriately function as described above, the structure (composition, thickness, and the like) of the HC layer 25 may be appropriately set.

In addition, in FIG. 2, although being formed over the entire upper surface of the antiferromagnetic layer 24, the HC layer 25 is not limited thereto and may be formed thereon to partially have a non-covering portion. However, when the HC layer 25 is formed over the entire surface of the antiferromagnetic layer 24, since the remnant orthogonal component of the free magnetic layer 23 can be appropriately reduced, and hence, the measurement accuracy can be preferably improved.

2. Method for Manufacturing Magnetic Sensor

A method for manufacturing a magnetic sensor according to one embodiment of the present invention is not limited. According to the method described below, the magnetic sensor according to this embodiment can be efficiently manufactured.

The seed layer 20 is formed on a substrate 29 with an insulating layer which is not shown in FIG. 2 and which is provided therebetween, and the fixed magnetic layer 21 having a self-pining structure is laminated on the seed layer 20. In particular, as shown in FIG. 2, the first magnetic layer 21a, the nonmagnetic interlayer 21b, and the second magnetic layer 21c are sequentially laminated to each other. The film formation method of each layer is not limited. Sputtering may be mentioned by way of example. While a magnetic field is applied, if the first magnetic layer 21a is formed so as to be magnetized along the width direction D2 shown in FIG. 1, the second magnetic layer 21c can be strongly magnetized in a direction antiparallel to the magnetization direction of the first magnetic layer 21a by the RKKY interaction. To the second magnetic layer 21c thus magnetized, even when a magnetic field in a direction different from that thereof is applied in a subsequent manufacturing process, the state magnetized in the width direction D2 can be maintained without receiving any influences therefrom.

Next, the nonmagnetic material layer 22 is laminated on the fixed magnetic layer 21. The lamination method of the nonmagnetic material layer 22 is not limited, and sputtering may be mentioned as a particular example.

Next, while a magnetic field in a direction along the longitudinal direction D1 is applied, the free magnetic layer 23, the antiferromagnetic layer 24, and the HC layer 25 are sequentially laminated on the nonmagnetic material layer 22. The lamination method of those layers is not limited, and sputtering may be mentioned as a particular example. Since the magnetic field film formation is performed as described above, the exchange coupling bias is generated with the antiferromagnetic layer 24 in a direction along the magnetization direction of the free magnetic layer 23, and in the HC layer 25 magnetized in the same direction as the magnetization direction of the free magnetic layer 23, the exchange coupling bias is generated with the antiferromagnetic layer 24 in the direction along the magnetization direction of the HC layer 25. Hence, even when the film formation is completed, and the application of the magnetic field is completed, by the exchange coupling bias generated with the antiferromagnetic layer 24, the free magnetic layer 23 and the HC layer 25 can be maintained so that the magnetization directions thereof are aligned in the same direction as the longitudinal direction D1. In addition, during the film formation of those layers, although the magnetic field is also applied to the fixed magnetic layer 21, since the fixed magnetic layer 21 has a pinning structure based on the RKKY interaction, the magnetization direction is not changed by the magnetic field thus applied.

In this case, when an IrMn-based material is used as a material forming the antiferromagnetic layer 24, by magnetic field film formation without performing any particular heat treatment, the magnetization direction of the antiferromagnetic layer 24 can be aligned. Hence, through the entire process for manufacturing the magnetoresistive effect element 11, a process without performing a magnetic field annealing treatment can be carried out. As the manufacturing process of the magnetoresistive effect element 11, when a process free from magnetic field annealing is used, a magnetoresistive effect element 11 having different sensitivity axes (including the case in which the magnetization directions are opposite to each other) on the same substrate can be easily manufactured. In the case in which the manufacturing process of the magnetoresistive effect element 11 requires a magnetic field annealing treatment, when the magnetic field annealing treatment is performed a plurality of times, the effect obtained by a magnetic field annealing treatment performed previously is reduced, and the magnetization direction may be difficult to be appropriately set in some cases.

As described above, after the free magnetic layer 23, the antiferromagnetic layer 24, and the HC layer 25 are formed by the magnetic field film formation, finally, the protective layer 26 is laminated. The lamination method of the protective layer 26 is not limited, and sputtering may be mentioned as a particular example.

A removable machining (milling) is performed on the laminate structure obtained by the film formation steps described above, so that the state in which the long patterns 12 are arranged along the width direction D2 is formed. The electric conduction portions 13 connecting those long patterns 12 and the connection terminals 14 connecting the electric conduction portions 13 are formed, so that the magnetoresistive effect element 11 having a meandering shape shown in FIG. 1 is obtained.

3. Current Sensor

A magnetic sensor including the magnetoresistive effect element according to one embodiment of the present invention may be preferably used as a current sensor. Although the current sensor as described above may have the structure including one magnetoresistive effect element, as described in International Publication No. 2012/081377 and Japanese Unexamined Patent Application Publication No. 2012-185044, a bridge circuit is preferably formed using four elements to improve the measurement accuracy. In the method for manufacturing the magnetoresistive effect element according to one embodiment of the present invention, since no magnetic field annealing treatment is performed in a preferable example, a plurality of magnetoresistive effect elements can be easily manufactured on the same substrate.

As a particular example of the current sensor according to one embodiment of the present invention, a magnetic proportional current sensor and a magnetic equilibrium current sensor may be mentioned.

The magnetic proportional current sensor is formed to have at least one magnetoresistive effect element (magnetoresistive effect element has a laminate structure in which a fixed magnetic layer and a free magnetic layer are laminated to each other with a nonmagnetic material layer provided therebetween; an antiferromagnetic layer which can generate an exchange coupling bias with the free magnetic layer and which can align the magnetization direction thereof in a predetermined direction in a magnetization changeable state is provided at a side of the free magnetic layer opposite to the side thereof facing the nonmagnetic material layer; a ferromagnetic layer which generates an exchange coupling bias with the antiferromagnetic layer and which can align the magnetization direction thereof in a predetermined direction in a magnetization changeable state is provided at a side of the antiferromagnetic layer opposite to the side thereof facing the free magnetic layer; the magnetization direction based on the exchange coupling bias generated in the free magnetic layer is the same direction as the magnetization direction based on the exchange coupling bias generated in the ferromagnetic layer; and the ferromagnetic layer can impart a reflux magnetic field having a component in a direction along the sensitivity axis to the free magnetic layer) according to one embodiment of the present invention and has a magnetic field detection bridge circuit including two outputs generating the potential difference in accordance with the induction magnetic field from the current to be measured. In addition, by the magnetic proportional current sensor, the current to be measured is measured by the difference in potential output from the magnetic detection bridge circuit in accordance with the induction magnetic field.

The magnetic equilibrium current sensor is formed to include at least one magnetoresistive effect element according to one embodiment of the present invention and includes a magnetic field detection bridge circuit having two outputs generating the potential difference in accordance with the induction magnetic field from the current to be measured and a feedback coil which is arranged in the vicinity of the magnetoresistive effect element and which generates a cancel magnetic field canceling the induction magnetic field. In addition, in the magnetic equilibrium current sensor, based on the current flowing through the feedback coil at the equilibrium state in which the induction magnetic field and the cancel magnetic field are cancelled to each other by a current supplied in the feedback coil, the current to be measured is measured.

The embodiments are described so as to facilitate the understanding of the present invention and are not described to limit the present invention. Hence, the respective elements disclosed in the above embodiments are to be understood to include all the design modifications and the equivalents within the technical scope of the present invention.

For example, as the magnetization control of the free magnetic layer 23, together with the antiferromagnetic layer 24 which is not required to be processed by an annealing treatment in a magnetic field, a hard bias layer which has been used in the past may also be used in an auxiliary manner.

EXAMPLES

Hereinafter, although the present invention will be described in more detail with reference to examples and the like, the scope of the present invention is not limited to those examples and the like.

On a substrate having an insulating film, a seed layer 20: NiFeCr (42)/fixed magnetic layer 21 [first magnetic layer 21$a$; $Fe_{60}Co_{40}$ (19)]/nonmagnetic interlayer 21$b$; Ru (3.6)/second magnetic layer 21$c$; $Co_{90}Fe_{10}$ (24)]/nonmagnetic material layer 22; Cu (22)/free magnetic layer 23 [$Co_{90}Fe_{10}$ (10)/$Ni_{81}Fe_{19}$ (90)/$Co_{90}Fe_{10}$ (10)]/antiferromagnetic layer 24; $Ir_{22}Mn_{78}$ (60)/HC layer 25 [$Ni_{81}Fe_{19}$ (10)/$Ni_{82}Fe_{13}Nb_{5}$ (100)]/protective layer 26; Ta (100) were laminated in this order from the bottom, so that a laminate 1 was obtained. The numerical value in the parentheses indicates the film thickness, and the unit thereof is A°.

The magnetization direction of a magnetic field application magnet used to form the fixed magnetic layer 21 was changed by 90° from the magnetization direction of a magnetic field application magnet used to form the free magnetic layer 23, the antiferromagnetic layer 24, and the HC layer 25, and the layers were each formed by magnetic field film formation.

The laminate 1 thus obtained was milled, so that a structural body in which long patterns were arranged in a stripe pattern was obtained. Electric conduction portions were formed at the end positions of those long patterns, and the connection terminals were further formed so as to be connected to the electric conduction portions, so that a magnetoresistive effect element having a meandering shape was formed.

Except that the HC layer 25 was not formed, a laminate 2 was manufactured by a manufacturing method similar to that of the laminate 1. From this laminate 2, a magnetoresistive effect element having no HC layer was manufactured.

The milling conditions for the laminates 1 and 2 described above were changed, so that magnetoresistive effect elements having different designed stripe widths were formed. On each of those magnetoresistive effect elements, an external magnetic field of ±500 Oe (± approximately 40 kA/m) was applied, and the zero-magnetic field hysteresis (unit: percentage to the full scale) was measured.

Figure 3:
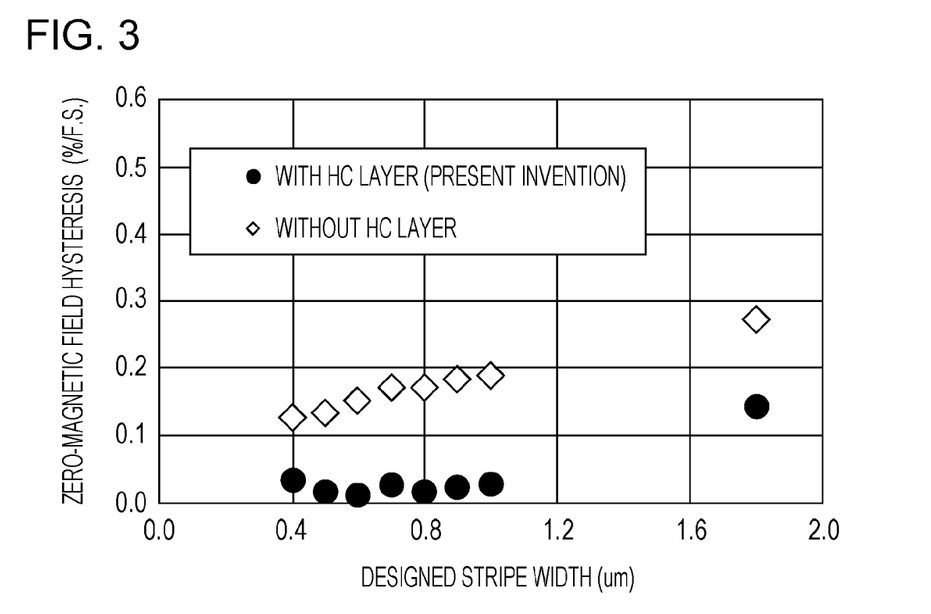
FIG. 3 is a graph showing a designed stripe-width dependence of zero-magnetic field hysteresis.

As a result, the results shown in FIG. 3 were obtained. It was confirmed that by the introduction of the HC layer, the zero-magnetic field hysteresis of the magnetoresistive effect element could be reduced without decreasing the designed stripe width.

Figure 4:
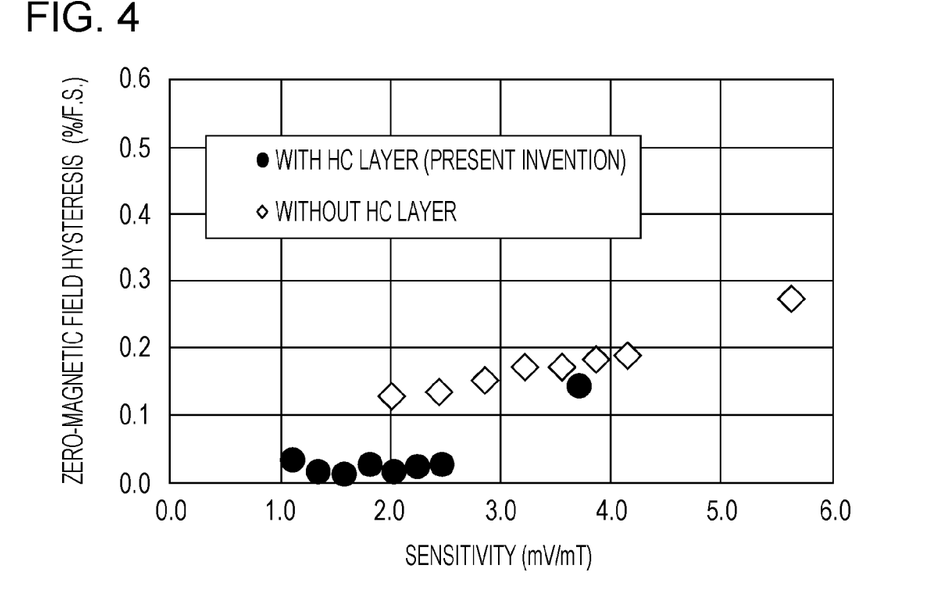
FIG. 4 is a graph showing a sensitivity dependence of zero-magnetic field hysteresis.

In addition, in FIG. 3, when the sensitivity (unit: mV/mT) adjustable by changing the designed stripe width was again plotted along the horizontal axis, the results as shown in FIG. 4 were obtained.

Figure 5:
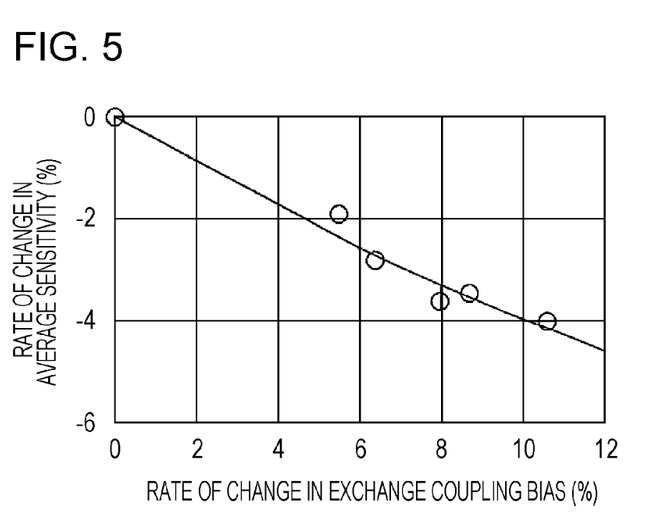
FIG. 5 is a graph showing the dependence of the rate of change in average sensitivity on the rate of change in magnitude of exchange coupling bias.

A treatment was performed so that heating at 150° C. was performed on the magnetoresistive effect element (based on the laminate 2) having no HC layer and then maintained for a predetermined time. As for the magnetoresistive effect element thus treated, based on the value obtained before the heating treatment at 150° C. was performed, the relationship between the rate of change in average sensitivity (vertical axis) and the rate of change in magnitude of the exchange coupling bias (horizontal axis) was shown in the graph. The results are shown in FIG. 5. In addition, the plots indicate the results obtained, from the left side, before the heat treatment, after the storage for 100 hours, 200 hours, 500 hours, 700 hours, and 1,000 hours. As shown in FIG. 5, it was confirmed that as the storage time was longer, the rate of change in magnitude of the exchange coupling bias was gradually increased, and the rate of change in average sensitivity was decreased. Accordingly, it was found that by the high-temperature storage, the magnitude of the exchange coupling bias of the free magnetic layer 23 was changed in a manner similar to that of the magnitude of the exchange coupling bias of the HC layer 25 and that regardless of whether the high-temperature storage was performed or not and regardless of the time thereof, by the reflux magnetic field from the HC layer 25, the hysteresis could be appropriately reduced.

Figure 6:
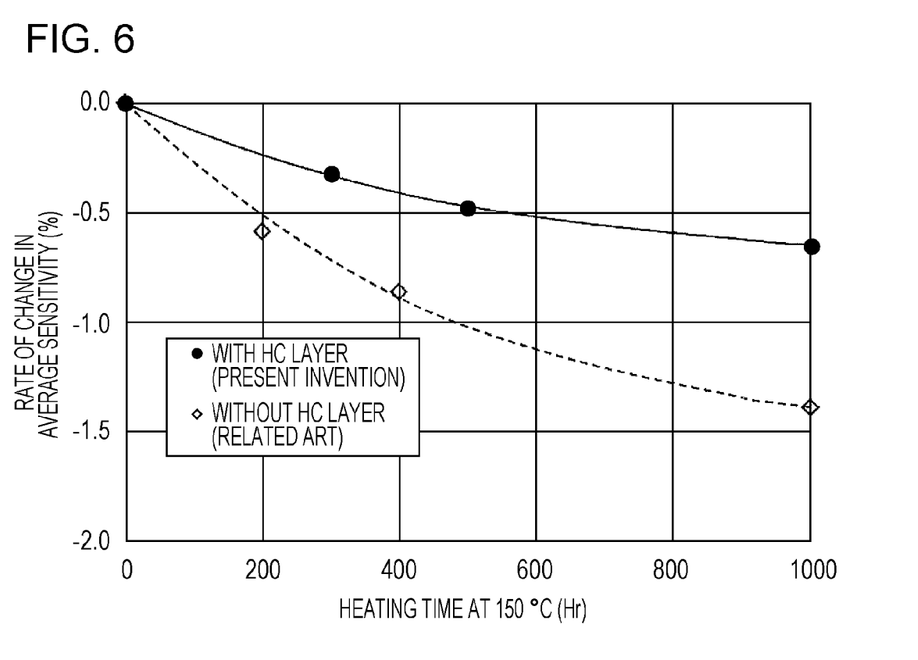
FIG. 6 is a graph showing the dependence of the rate of change in average sensitivity on a heating time at 150° C.

A heat treatment was performed at 150° C. on the magnetoresistive effect element of each of the laminates 1 and 2. The high-temperature storage time dependence of the rate of change in average sensitivity of the magnetoresistive effect element thus treated was measured using the value obtained before the heat treatment at 150° C. was performed as the reference. The results are shown in FIG. 6. As shown in FIG. 6, by the introduction of the HC layer, the change in sensitivity caused by the high-temperature storage of the magnetoresistive effect element can be reduced.

A magnetic sensor including the magnetoresistive effect element according to one embodiment of the present invention may be preferably used as a constituent element of a current sensor of an electric car or a hybrid car.

What is claimed is:

1. A magnetic sensor, comprising:
a magnetoresistive effect element having a sensitivity axis in a specific direction, the magnetoresistive effect element including:
a laminate structure in which a fixed magnetic layer and a free magnetic layer are laminated to each other with a nonmagnetic material layer provided therebetween, wherein
at a side of the free magnetic layer opposite to the side thereof facing the nonmagnetic material layer, an antiferromagnetic layer which generates an exchange coupling bias with the free magnetic layer and which aligns the magnetization direction of the free magnetic layer in a predetermined direction in a magnetization changeable state is provided,
at a side of the antiferromagnetic layer opposite to the side thereof facing the free magnetic layer, a ferromagnetic layer which generates an exchange coupling bias with the antiferromagnetic layer and which is able to align the magnetization direction thereof in a predetermined direction in a magnetization changeable state is provided,
the magnetization direction based on the exchange coupling bias generated in the free magnetic layer is the same direction as the magnetization direction based on the exchange coupling bias generated in the ferromagnetic layer, and
the ferromagnetic layer is able to impart a reflux magnetic field having a component in a direction along the sensitivity axis to the free magnetic layer.

2. The magnetic sensor according to claim 1,
wherein the magnitude of the exchange coupling bias generated in the ferromagnetic layer and the thickness thereof are set so as to reduce the component of a remnant magnetization of the free magnetic layer in the direction along the sensitivity axis.

3. A current sensor including the magnetic sensor according to claim 2, wherein the current sensor further includes a magnetic field detection bridge circuit and the current to be measured is measured by the difference in potential output from the magnetic field detection bridge circuit in accordance with an induction magnetic field.

4. The magnetic sensor according to claim 1,
wherein the antiferromagnetic layer is formed of IrMn.

5. A current sensor including the magnetic sensor according to claim 4, wherein the current sensor further includes a magnetic field detection bridge circuit and the current to be measured is measured by the difference in potential output from the magnetic field detection bridge circuit in accordance with an induction magnetic field.

6. The magnetic sensor according to claim 1,
wherein the fixed magnetic layer is a laminate in which a first magnetic layer and a second magnetic layer in contact with the nonmagnetic material layer are laminated to each other with a nonmagnetic interlayer provided therebetween, and the first magnetic layer and the second magnetic layer form a self-pinning structure in which the magnetizations thereof are fixed in antiparallel to each other.

7. A current sensor including the magnetic sensor according to claim 6, wherein the current sensor further includes a magnetic field detection bridge circuit and the current to be measured is measured by the difference in potential output from the magnetic field detection bridge circuit in accordance with an induction magnetic field.

8. The magnetic sensor according to claim 1,
wherein the magnitude of the exchange coupling bias generated in the ferromagnetic layer and the thickness thereof are set so as to reduce a high-temperature storage time dependence of the sensitivity of the free magnetic layer.

9. A current sensor including the magnetic sensor according to claim 8, wherein the current sensor further includes a magnetic field detection bridge circuit and the current to be measured is measured by the difference in potential output from the magnetic field detection bridge circuit in accordance with an induction magnetic field.

10. A current sensor including the magnetic sensor according to claim 1, wherein the current sensor further includes a magnetic field detection bridge circuit and the current to be measured is measured by the difference in potential output from the magnetic field detection bridge circuit in accordance with an induction magnetic field.

* * * * *